Nov. 7, 1961 W. A. CAWTHRA 3,008,092

TRANSISTOR AMPLIFIERS

Filed Jan. 21, 1958 3 Sheets-Sheet 1

INVENTOR
W. A. CAWTHRA

Nov. 7, 1961 W. A. CAWTHRA 3,008,092

TRANSISTOR AMPLIFIERS

Filed Jan. 21, 1958 3 Sheets-Sheet 2

INVENTOR

W. A. CAWTHRA

Nov. 7, 1961 W. A. CAWTHRA 3,008,092

TRANSISTOR AMPLIFIERS

Filed Jan. 21, 1958 3 Sheets-Sheet 3

INVENTOR
W. A. CAWTHRA 3,008,092
Patented Nov. 7, 1961

3,008,092

TRANSISTOR AMPLIFIERS

William Alexander Cawthra, London, England, assignor to Modern Telephones (Great Britain) Limited, London, England, a British company Filed Jan. 21, 1958, Ser. No. 710,233
Claims priority, application Great Britain Jan. 21, 1957
1 Claim. (Cl. 330—79)

This invention relates to multi-stage transistor amplifiers having negative feedback. By a multi-stage transistor amplifier is meant one having two or more transistor stages.

According to this invention, in a multi-stage transistor amplifier having negative feedback, the degenerative feedback voltage is fed into the input of one stage of the amplifier across an impedance in series with the input to that stage and preferably across an impedance in series with the input line to the base of that stage. With this arrangement, the feedback circuit tends to increase the effective impedance of the load on the preceding stage and thus enables a greater output to be obtained from that stage.

In general to avoid unwanted phase shifts, the degenerative feedback voltage is preferably developed across a resistance in series with the input line. This resistance may, for example, be fed from the amplifier output by a transformer coupling providing an output current which is passed through the resistance.

Figure 1:
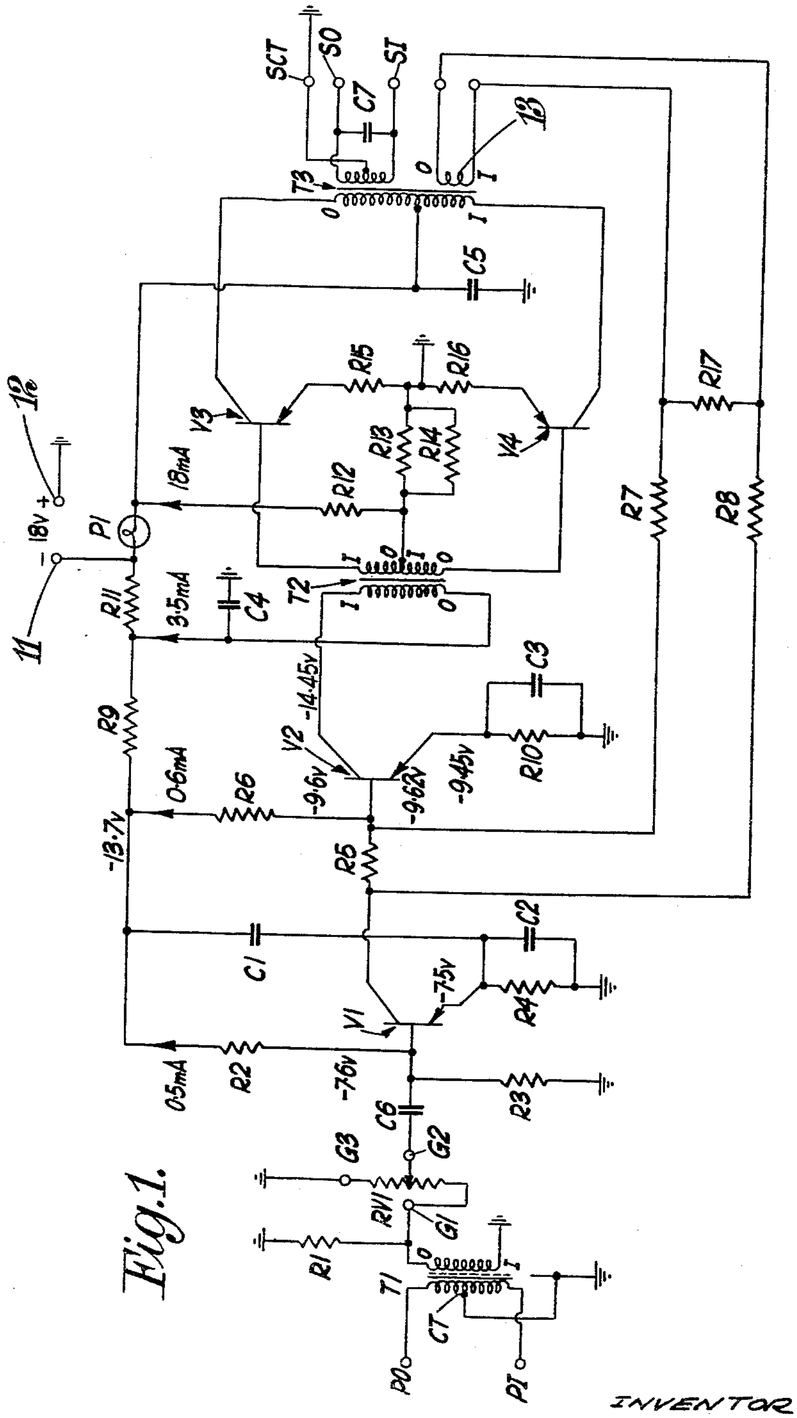
Figure 2:
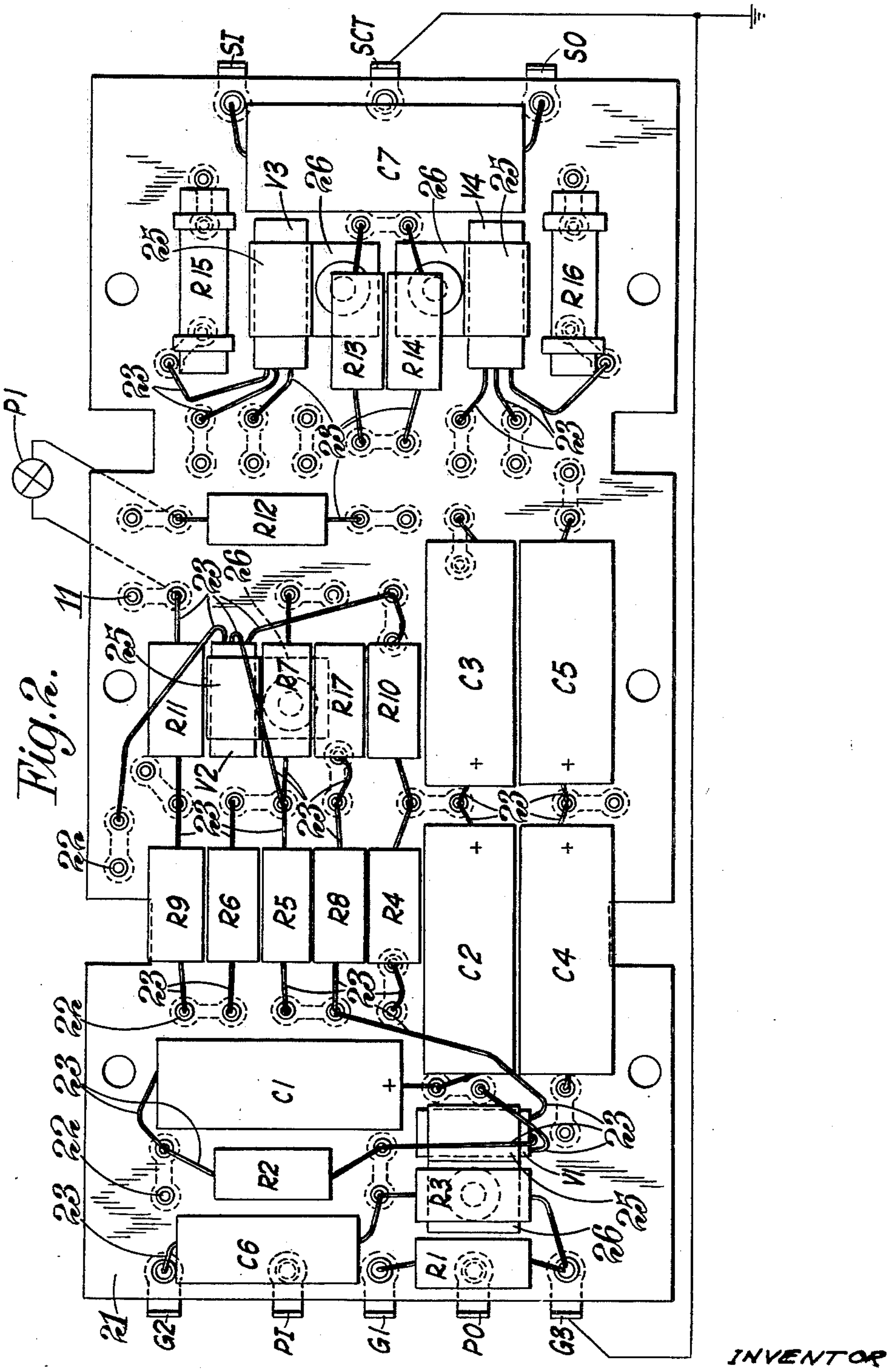
Figure 3:
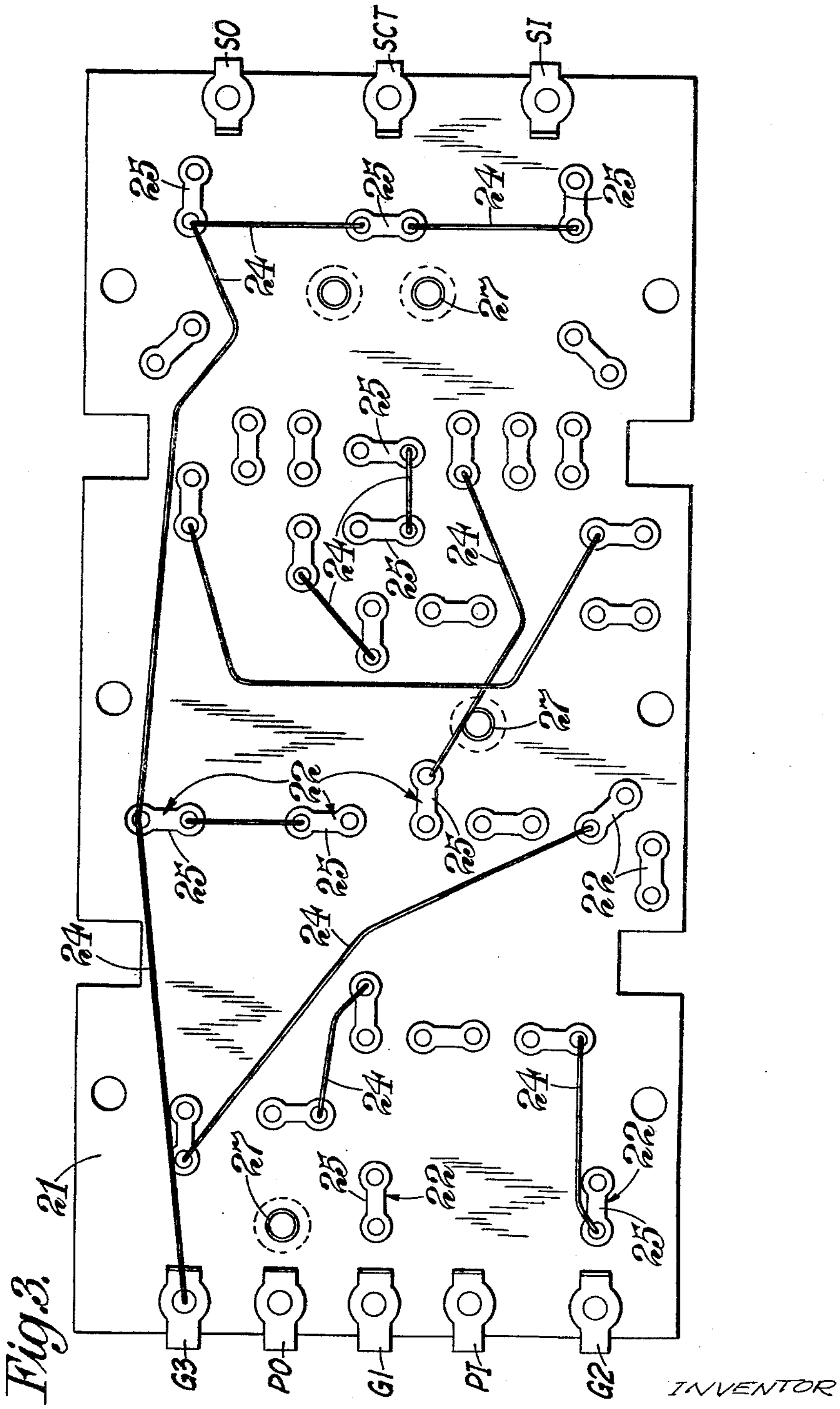

A specific amplifier embodying the invention will now be described by way of example and with reference to the accompanying drawings, in which, FIGURE 1 is a circuit diagram of the amplifier, FIGURE 2 shows an electrical circuit assembly forming part of the amplifier, and, FIGURE 3 shows the underside of that circuit assembly.

In this example the amplifier includes four junction type transistors V1, V2, V3 and V4, The transistors V1 and V2, together with their associated circuit elements, constitute two amplifying stages. The transistors V3 and V4, together with their associated circuit elements constitute a push-pull output stage. The terminals 11, 12 are connected to an 18 volt D.C. power supply with the polarity indicated, and the values of various voltages and currents in various parts of the circuit when it is in its quiescent condition, i.e. with zero input signal, are indicated in FIGURE 1. The input signal is connected to the terminals PI, PO by a twisted pair of insulated conductors and is fed through the input transformer T1, the gain control potentiometer RV1 and capacitor C6 to the base of the transistor V1. The output from the collector of transistor V1 is fed through the resistor R5 to the base of the transistor V2. The output from the collector of transistor V2 is fed through the inter-stage coupling transformer T2 to the bases of the transistors V3, V4. The output from the collectors of the transistors V3, V4 is connected through the output transformer T3 to the output terminals SI, SO and the loudspeaker or other load is connected to those terminals by a twisted pair of insulated conductors. In this example, the amplifier is designed to be fed from a source having an impedance of 60 ohms and to feed a load having an impedance of 60 ohms. The inner and outer ends of the various transformer windings are indicated respectively by the reference letters I and O.

The output transformer T3 has a feedback secondary winding 13 which is connected to the resistor R5 through the resistor network R7, R8, R17. The degenerative feedback voltage is thus developed across the resistor R5, which is in series with the input line to the base of transistor V2. This feedback increases the effective impedance of the load on the stage V1 and thus enables a greater output to be obtained from that stage. The overall power gain of the amplifier in this example is 80 decibels, of which a large proportion is due to the first stage being followed by a relatively high impedance as aforesaid.

A tungsten filament lamp P1 has a resistance which increases with the current through it and, as may be seen from FIGURE 1, it is connected in series with the power supply lead from the terminal 11 to the output stage. The capacitor C5 is connected in shunt across the power input supply circuit on the output stage side of the lamp P1. The capacitor C5 ensures a substantially constant input supply voltage to the output stage during short peaks of speech signals when the amplifier tends to draw a heavy current from the supply but, if a high level input signal is prolonged so that the amplifier tends to draw a heavy current for a relatively long period, the resulting increased resistance of the lamp P1 will reduce the supply voltage of the output stage so that the supply voltage applied to that stage will gradually fall as the capacitor C5 discharges. The protective circuit P1, C5 protects the output stage against any prolonged excessive input signal.

The variation in brightness of the lamp during use of the amplifier gives an indication of the amplitude of modulation and can be used as a guide in setting the gain control RV1 for correct operation of the amplifier. The gain control RV1 is correctly set when, with a speech signal input to the amplifier, the lamp P1 is normally of a medium red appearance but occasionally comes to full brightness.

The circuit elements of FIGURE 1, with the exception of the transformers T1, T2, T3, the potentiometer RV1 and the lamp P1, are embodied in the circuit assembly shown in FIGURES 2 and 3. That assembly comprises a plate of insulating material 21 having secured thereon a large number of multiple metal eyelet units 22 to which the connecting wires 23 of the various circuit elements, and other connecting wires 24 are soldered. Each of the multiple metal eyelet units 22 comprises two eyelets having their heads connected by an integral bridge 25. These eyelets extend through holes preformed in the insulating plate 21 and are "eyeleted" or turned over at the ends which protrude through the upper face of the plate 21. The transistors V1, V2, V3, V4 are supported by sleeves 25 having flanges 26 which are secured to the insulating plate 21 by eyelets 27. The terminals PI, PO, G1, G2, G3, SI, SO, SCT are provided as tags secured to the insulating plate 21. Those tags are in the form of eyelets having suitable shaped tag heads.

The transformers T1, T2, T3, the lamp P1, the potentiometer RV1 and the power supply are connected to the circuit assembly shown in FIGURES 2 and 3 by means of flying leads soldered to the appropriate eyelets and tags.

The above described circuit assembly forms the subject of British co-pending application No. 2081/57.

Other features of the amplifier of this example form the subject of British co-pending application No. 2091/57.

Details of the various circuit elements are as follows:

V1—transistor type OC71
V2—transistor type OC71
V3—transistor type OC76 or OC72
V4—transistor type OC76 or OC72
R1—6,800 ohms ±20%, Erie Type 9
R2—13,000 ohms ±5%, Erie Type 9
R3—16,000 ohms ± 5%, Erie Type 9
R4—12,000 ohms ±10%, Erie Type 9
R5—330 ohms ±10%, Erie Type 9
R6—6,800 ohms ±10%, Erie Type 9
R7—2,200 ohms ±10%, Erie Type 9

R8—2,200 ohms ±10%, Erie Type 9
R9—1,200 ohms ±10%, Erie Type 9
R10—2,700 ohms ±10%, Erie Type 9
R11—680 ohms ±10%, Erie Type 9
R12—820 ohms ±10%, Erie Type 9
R13—15 ohms ±10%, Erie Type 9
R14—15 ohms ±10%, Erie Type 9
R15—1.7 ohms ±5% N.S.F. ½ watt
R16—1.7 ohms ±5% N.S.F. ½ watt
R17—1,500 ohms ±20%, Erie Type 9
RV1—potentiometer 20,000 ohms, semi-log type
C1—25 microfarads, 25 volts working, Plessey Type CE 200
C2—25 microfarads, 25 volts working, Plessey Type CE 200
C3—25 microfarads, 25 volts working, Plessey Type CE 200
C4—25 microfarads, 25 volts working, Plessey Type CE 200
C5—25 microfarads, 25 volts working, Plessey Type CE 200
C6—0.1 microfarad, 150 volts working, Dubilier Type 410
C7—1 microfarad, 150 volts working, Dubilier Type 410
T1—input transformer; voltage step-up ratio 7.7:1 Primary centre-tapped
T2—inter-stage transformer; voltage step-down ratio 2.5:1
T3—output transformer voltage step-down ratio 1:1.75 for each half of the output winding with respect to each half of the primary winding; and voltage step-up ratio of 4:1.75 for the feedback winding 13 with respect to each half of the primary winding
P1—tungsten filament lamp, 8 volts 50 milliamps.

The invention is not restricted to the details of the foregoing example.

I claim:

A multistage transistor amplifier, comprising first and second transistors each having input, output and control electrodes, the output electrode of said first transistor being direct-coupled over a first resistor to the control electrode of said second transistor, a bias source, a second resistor connected between said bias source and the opposite side of said first resistor from said first transistor, said second resistor being substantially greater than said first resistor, whereby said resistors constitute the load impedance for said first transistor, an amplifier stage coupled to the output electrode of said second transistor, and a degenerative voltage feedback circuit coupled from the output of said amplifier stage across said first resistor, whereby degenerative feedback increases the effective impedance of the load on said first transistor thereby increasing the output therefrom.

References Cited in the file of this patent

UNITED STATES PATENTS

| | | |
|---|---|---|
| 2,563,245 | Jofeh | Aug. 7, 1951 |
| 2,801,296 | Blecher | July 30, 1957 |
| 2,874,236 | Sikorra | Feb. 17, 1959 |

FOREIGN PATENTS

| | | |
|---|---|---|
| 497,555 | Great Britain | Dec. 21, 1938 |
| 537,119 | Great Britain | June 10, 1941 |
| 604,024 | Germany | Oct. 12, 1934 |

OTHER REFERENCES

Stern: "Internal Feedback . . . Transistor Amplifiers," published in Proceedings of the IRE, July 1955, pages 838–847.

Radiotron Designer's Handbook, page 312, fourth edition, published 1953, reproduced and distributed by Tube Division of RCA, Harrison, N.J.